(12) United States Patent
Suzuki

(10) Patent No.: US 8,500,491 B2
(45) Date of Patent: Aug. 6, 2013

(54) ELECTRICAL CONNECTION DEVICE

(75) Inventor: Tomoyuki Suzuki, Anjo (JP)

(73) Assignee: Aisin Aw Co., Ltd., Anjo (JP)

( * ) Notice: Subject to any disclaimer, the term of this patent is extended or adjusted under 35 U.S.C. 154(b) by 40 days.

(21) Appl. No.: 13/211,672

(22) Filed: Aug. 17, 2011

(65) Prior Publication Data

US 2012/0058681 A1 Mar. 8, 2012

(30) Foreign Application Priority Data

Sep. 2, 2010 (JP) ................................. 2010-196633

(51) Int. Cl.
*H01R 24/00* (2006.01)

(52) U.S. Cl.
USPC ...................................................... 439/626

(58) Field of Classification Search
USPC .................. 439/212, 626, 656, 949
See application file for complete search history.

(56) References Cited

U.S. PATENT DOCUMENTS

| | | | |
|---|---|---|---|
| 6,066,006 A * | 5/2000 | Shaw | 439/736 |
| 6,479,888 B1 | 11/2002 | Hirashima et al. | |
| 7,104,845 B2 * | 9/2006 | Higuchi et al. | 439/620.26 |
| 7,591,660 B1 * | 9/2009 | Eichhorst | 439/212 |
| 7,632,110 B2 * | 12/2009 | Kanou et al. | 439/76.2 |
| 8,199,520 B2 * | 6/2012 | Kishino et al. | 361/775 |
| 2009/0067131 A1 | 3/2009 | Yasuda et al. | |
| 2009/0257211 A1 * | 10/2009 | Kontani et al. | 361/782 |
| 2010/0194381 A1 * | 8/2010 | Ito et al. | 324/117 R |
| 2012/0231666 A1 * | 9/2012 | Takahashi et al. | 439/626 |

FOREIGN PATENT DOCUMENTS

| | | |
|---|---|---|
| JP | A-2000-307017 | 11/2000 |
| JP | A-2009-070999 | 4/2009 |
| JP | A-2010-103222 | 5/2010 |

OTHER PUBLICATIONS

Aug. 30, 2011 International Search Report issued in PCT/JP2011/067675 (with translation).

* cited by examiner

*Primary Examiner* — Renee S Leubke
*Assistant Examiner* — Larisa Tsukerman
(74) *Attorney, Agent, or Firm* — Oliff & Berridge, PLC

(57) ABSTRACT

An electrical connection device configured with a conductive connection member having a joint portion joined to an electrode member while being pressed against the electrode member in a pressing direction. An insulating support body supports the connection member such that the connection member includes the joint portion which is formed in a flat plate shape and is brought into surface contact with a joint surface of the electrode member. Crossover portions sandwich the joint portion and extend toward both sides along a predetermined extending direction. Supported portions are provided at respective end portions, opposite the joint portion, of the crossover portions on both sides. The support body is disposed at least on both sides of the joint portion in the extending direction and spaced apart from the joint portion, and formed to integrally support the supported portions on both sides of the joint portion.

19 Claims, 4 Drawing Sheets

ELECTRICAL CONNECTION DEVICE

INCORPORATION BY REFERENCE

The disclosure of Japanese Patent Application No. 2010-196633 filed on Sep. 2, 2010 including the specification, drawings and abstract is incorporated herein by reference in its entirety.

BACKGROUND OF THE INVENTION

The present invention relates to an electrical connection device that includes a conductive connection member having a joint portion to be joined to an electrode member in the state of being pressed against the electrode member in a predetermined pressing direction, and an insulating support body that supports the connection member.

Description of the Related Art

In recent years, hybrid vehicles and electric vehicles including a rotary electric machine as a drive power source have been drawing attention from the viewpoint of conserving energy and reducing the load on the environment. In such hybrid vehicles and electric vehicles, an inverter device controls a current flowing through the rotary electric machine. The inverter device includes an inverter circuit formed by circuit elements such as switching elements. Electrode members for the circuit elements such as the switching elements forming the inverter circuit are electrically connected to a power source, the rotary electric machine, or the like through an electrical connection device including connection members (such as bus bars, for example). Such an electrical connection device for electrical connection between the electrode members and other members is generally required not only for the inverter device but also for devices that include an electric circuit or an electronic circuit.

An example of the electrical connection device described above according to the related art is described in Japanese Patent Application Publication No. JP-A-2010-103222 (FIG. 1 etc.) below, for example. In the following description in the Description of the Related Art section, reference numerals used in Japanese Patent Application Publication No. JP-A-2010-103222 are used. In the configuration described in Japanese Patent Application Publication No. JP-A-2010-103222, as shown in FIG. 1 etc. of the document, a connection member (external connection terminals 50, 51, and 52) is supported by a support body (resin case 40). The connection member extends from the support body toward an electrode member (terminal blocks 60a, 60b, 61a, 61b, 62a, and 62b) to which the connection member is to be joined, and the lower surface of the connection member and the upper surface of the electrode member are joined to each other.

The connection member and the electrode member are joined to each other by laser welding or the like, for example. From the viewpoint of enhancing the reliability of the joint, it is desirable that the connection member and the electrode member should be joined to each other with the connection member and the electrode member in good surface contact with each other. This is because performing laser welding or the like at a portion where the members do not fully contact each other may result in an insufficient joint strength to cause a disconnection due to a current concentration, vibration, and so forth. However, Japanese Patent Application Publication No. JP-A-2010-103222 does not describe a state of contact between the connection member and the electrode member during joining, and naturally does not indicate any means for bringing the connection member into good surface contact with the electrode member during joining.

SUMMARY OF THE INVENTION

In view of the foregoing, it is desirable to provide an electrical connection device that facilitates bringing a connection member into good surface contact with an electrode member during joining.

An electrical connection device according to a first aspect of the present invention includes a conductive connection member having a joint portion to be joined to an electrode member in a state of being pressed against the electrode member in a predetermined pressing direction, and an insulating support body that supports the connection member, the electrical connection device being characteristically configured such that the connection member includes the joint portion which is formed in a flat plate shape and which is brought into surface contact with a joint surface of the electrode member, crossover portions sandwiching the joint portion and extending toward both sides along a predetermined extending direction, and supported portions provided at respective end portions, opposite the joint portion, of the crossover portions on both sides, and the support body is disposed at least on both sides of the joint portion in the extending direction and spaced apart from the joint portion, and formed to integrally support the supported portions on both sides of the joint portion.

According to the first aspect, the joint portion is supported by the support body via the crossover portions and the supported portions. Therefore, the joint portion can be pressed against the joint surface of the electrode member by applying a force in the pressing direction to the support body without directly applying a force to the joint portion. At this time, because the joint portion is supported by the support body on both sides in the extending direction, a load is applied to the joint portion from both sides in the extending direction. The support body is formed to integrally support the supported portions on both sides of the joint portion. Thus, it is easy to press the support body such that a load is applied to the joint portion equally or generally equally from both sides in the extending direction, and as a result, it is easy to bring the joint portion into good surface contact with the joint surface of the electrode member.

For supplementary description, even in a configuration in which a load can be applied to the joint portion from both sides in the extending direction, a load may be applied to the joint portion individually from both sides in the extending direction, such as in a configuration in which both sides of the joint portion are individually supported by the support body and a configuration in which one side of the joint portion is supported by the support body and the other side of the joint portion is pressed by a separate member that does not support the joint portion, for example. In such configurations, it is be difficult to apply a load to the joint portion equally or generally equally from both sides in the extending direction without a complicated configuration.

According to the first aspect described above, in contrast, the support body is formed to integrally support the supported portions on both sides of the joint portion. This makes it easy to press the support body such that a load is applied to the joint portion equally or generally equally from both sides in the extending direction, and as a result to bring the joint portion provided in the connection member into good surface contact with the joint surface of the electrode member during joining.

According to a second aspect of the present invention, the joint portion may include a bent portion that is provided at at least a portion of a peripheral portion of the joint portion and that is bent in a thickness direction.

According to the second aspect, the rigidity (deformation resistance) of the joint portion can be enhanced utilizing a physical shape and work hardening due to plastic deformation by forming the bent portion. Hence, it is possible to suppress deformation of the joint portion due to a stress produced in the connection member while being pressed against the electrode member, and to bring the joint portion of the connection member and the joint surface of the electrode member into reliable surface contact with each other during joining.

According to a third aspect of the present invention, the crossover portions may be formed in a belt shape, and a thickness direction of the crossover portions may extend in parallel with the pressing direction, and the crossover portions may be formed to be smaller than the joint portion in at least one of thickness and width.

According to the third aspect, the rigidity of the crossover portions can be reduced compared to the connection member, which enables a stress produced in the connection member to be absorbed through deformation of the crossover portions. Hence, it is possible to suppress deformation of the joint portion due to a stress produced in the connection member while being pressed against the electrode member, and to bring the joint portion of the connection member and the joint surface of the electrode member into reliable surface contact with each other during joining. According to the third aspect, in addition, the shape of the crossover portions can be simplified to reduce the cost.

According to a fourth aspect of the present invention, a pair of the crossover portions disposed on both sides of the joint portion in the extending direction may be shaped to be plane-symmetric to each other with respect to a plane that passes through a center of gravity of the joint portion and that is orthogonal to the extending direction.

The fourth aspect allows the pair of crossover portions to be equal in rigidity to each other, which enables a stress produced in the connection member while being pressed against the electrode member to be absorbed equally on both sides of the joint portion in the extending direction. Hence, it is further easier to press the support body such that a load is applied to the joint portion equally or generally equally from both sides in the extending direction.

According to a fifth aspect of the present invention, the connection member may include a plurality of the joint portions each supported by the support body via a pair of the crossover portions, and the support body may be formed to integrally support a plurality of pairs of the supported portions for the plurality of joint portions.

According to the fifth aspect, the plurality of joint portions can be pressed against the electrode members all at once by applying a force in the pressing direction to the support body. Hence, a process for joining the connection member to the electrode members can be simplified to reduce the manufacturing cost of an apparatus in which the electrical connection device according to the present invention is used.

According to a sixth aspect of the present invention, the support body may include a plurality of beam-shaped portions extending in the same direction as each other, the plurality of beam-shaped portions may include a retention beam-shaped portion, inside which the connection member is retained for fixation, and a non-retention beam-shaped portion, inside which the connection member is not retained for fixation, and the non-retention beam-shaped portion may be formed to be larger than the retention beam-shaped portion in thickness in the pressing direction.

According to the sixth aspect, it is possible to reduce the difference between the rigidity of the retention beam-shaped portion and the rigidity of the non-retention beam-shaped portion, and to prevent the support body from being significantly locally deformed while being pressed against the electrode member. Hence, it is further easier to press the support body such that a load is applied to the joint portion equally or generally equally from both sides in the extending direction.

According to a seventh aspect of the present invention, the supported portions of the connection member may be retained inside the support body for fixation, and the supported portions may be formed to be larger than the crossover portions in at least one of length in the pressing direction and length in a direction that is orthogonal to both the extending direction and the pressing direction, According to the seventh aspect, a load received by the support body from the connection member while being pressed against the electrode member can be dispersed within the support body, which enables the connection member to be supported by the support body over a wide range. Hence, it is possible to prevent the support body from being significantly locally deformed while being pressed against the electrode member, which makes it further easier to press the support body such that a load is applied to the joint portion equally or generally equally from both sides in the extending direction.

DETAILED DESCRIPTION OF THE EMBODIMENTS

Figure 1:
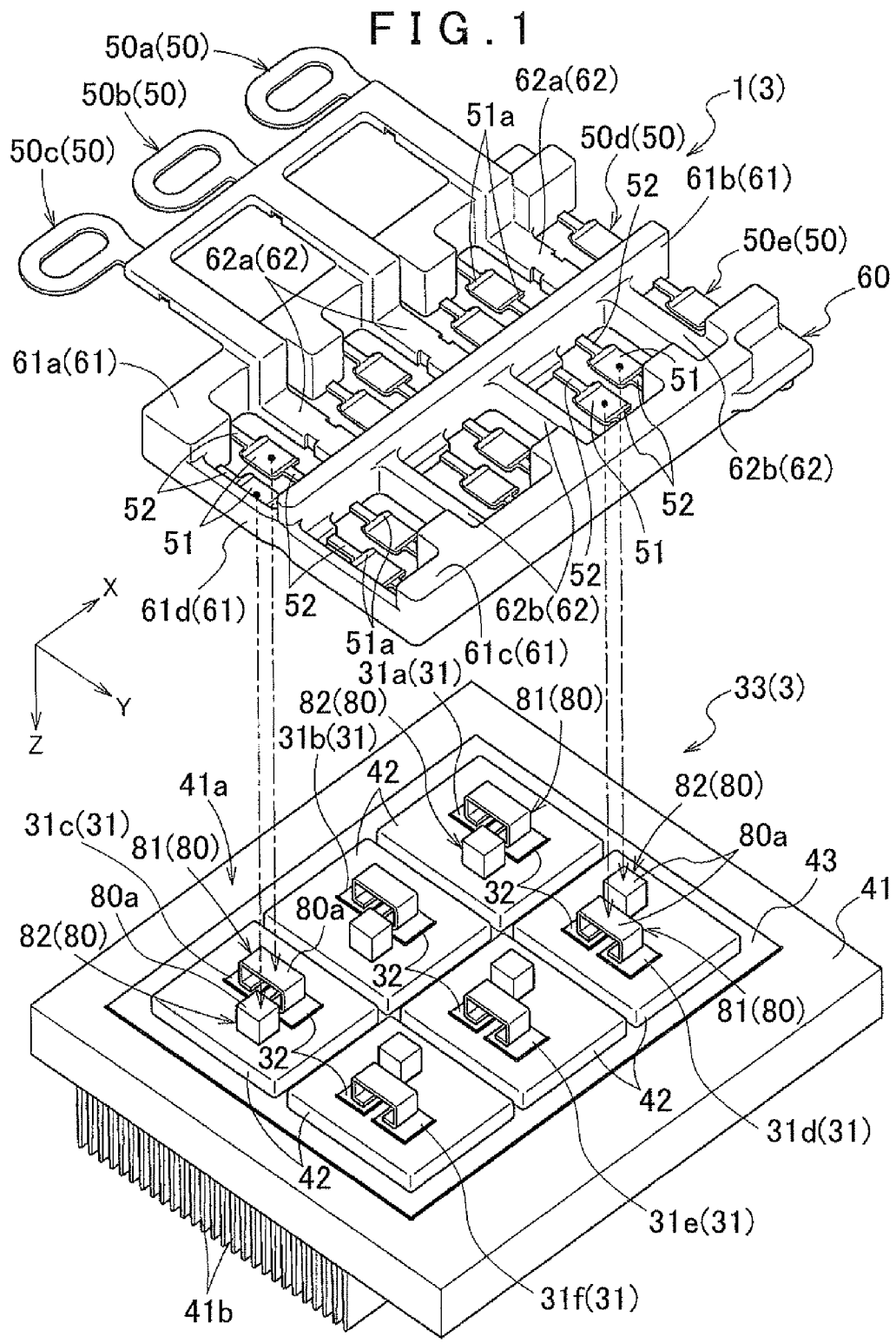
FIG. 1 is an exploded perspective view of an inverter module according to an embodiment of the present invention.

An electrical connection device according to an embodiment of the present invention will be described with reference to the drawings. Here, the electrical connection device according to the present invention is applied to a bus bar module 1 forming an inverter module 3 which controls a rotary electric machine 2. As shown in FIG. 1, the bus bar module 1 includes bus bars 50 having joint portions 51. The joint portions 51 are joined to electrode members 80 provided in a switching module 33 in the state of being pressed against the electrode members 80. In such a configuration, the bus bar module 1 according to the embodiment is characterized in the shape of the bus bars 50 and the configuration of a support body 60 that supports the bus bars 50. The configuration of the bus bar module 1 according to the embodiment will be described below in the order of "Overall Configuration of Inverter Module" and "Configuration of Bus Bar Module".

In the embodiment, the bus bar module 1 and the bus bars 50 correspond to the "electrical connection device" and the "connection member", respectively, according to the present invention. In the following description, unless otherwise noted, the term "upper" refers to the −Z direction in FIG. 1, and the term "lower" refers to the Z direction in FIG. 1. The Z direction coincides with the direction in which the joint portions 51 are pressed against the electrode members 80.

1. Overall Configuration of Inverter Module

The overall configuration of the inverter module 3 will be described with reference to FIGS. 1 to 3. As shown in FIG 1, the inverter module 3 includes the bus bar module 1 and the switching module 33. The bus bar module 1 is disposed above the switching module 33 in proximity to the switching module 33, and forms a current path between the switching module 33 and a power source (not shown) and a current path between the switching module 33 and the rotary electric machine 2 (see FIG. 3). In the embodiment, the rotary electric machine 2 is an AC electric motor driven by a three-phase AC, and is provided as a drive power source in an electric vehicle or a hybrid vehicle, for example. In the embodiment, the rotary electric machine 2 can function both as a motor (electric motor) that is supplied with electric power to produce power and as a generator (electric generator) that is supplied with power to produce electric power.

Figure 2:
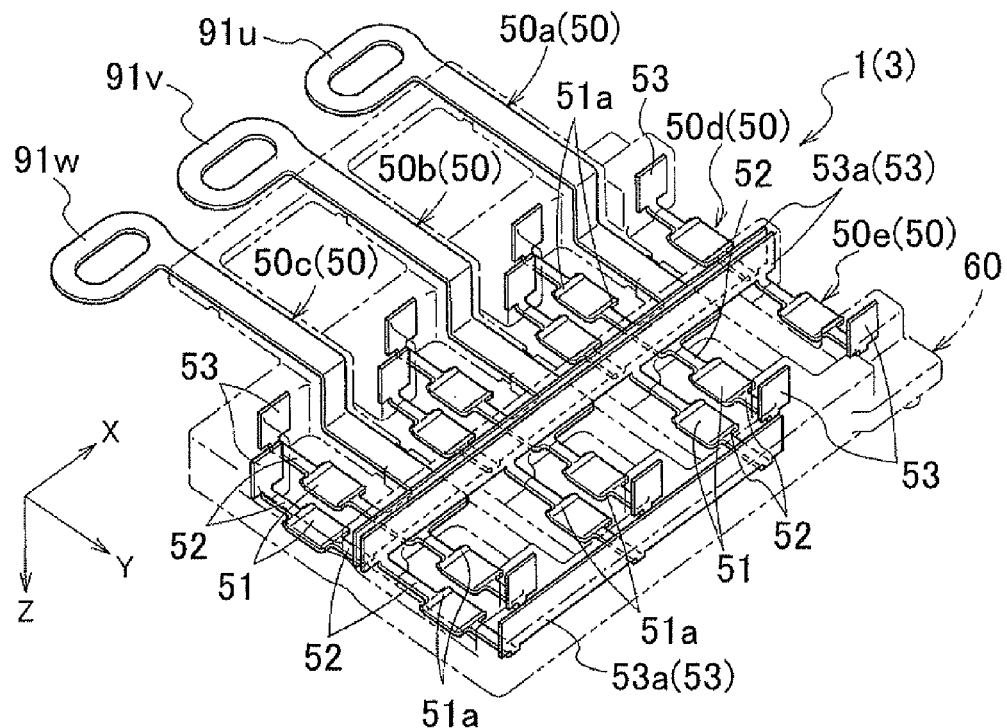
FIG. 2 is a transparent perspective view of a bus bar module according to the embodiment of the present invention.

As shown in FIGS. 1 and 2, the bus bar module 1 includes the bus bars 50 and the support body 60 which supports the bus bars 50. In the embodiment, the bus bar module 1 includes five bus bars 50, namely a first bus bar 50a, a second bus bar 50b, a third bus bar 50c, a fourth bus bar 50d, and a fifth bus bar 50e. The five bus bars 50 are integrally supported by the support body 60. The bus bars 50 are formed from a conductive material (for example, a metal material such as copper or aluminum).

Each of the bus bars 50 includes the joint portion 51 which is formed in a flat plate shape and which is brought into surface contact with a joint surface 80a of the electrode member 80, crossover portions 52 sandwiching the joint portion 51 and extending toward both sides along a predetermined extending direction (in the embodiment, Y direction), and supported portions 53 provided at respective end portions, opposite the joint portion 51, of the crossover portions 52 on both sides. The joint portion 51 is joined to the electrode member 80 provided in the switching module 33 in the state of being pressed against the electrode member 80 in the predetermined pressing direction Z. As shown in FIG. 1, the Y direction is defined as a direction that is orthogonal to the pressing direction Z.

The support body 60 is disposed at least on both sides of the joint portion 51 in the extending direction Y and spaced apart from the joint portion 51, and formed to integrally support the supported portions 53 on both sides of the joint portion 51. The support body 60 is formed from an insulating material (for example, various resins such as a polyphenylene sulfide resin). The configuration of the bus bar module 1 will be described in detail later in Section 2.

As shown in FIG. 1, the switching module 33 includes a base plate 41, an insulating sheet 43, and element substrates 42. The base plate 41, the insulating sheet 43, and the element substrates 42 are stacked in parallel with or generally in parallel with each other with the stacking direction coinciding with a direction in parallel with the Z direction.

The base plate 41 is a plate-like member serving as a base on which the insulating sheet 43 and the element substrates 42 are to be placed. The base plate 41 is formed from a metal material such as copper or aluminum. Heat radiation fins 41b are formed on the lower surface of the base plate 41. As shown in FIG. 1, the base plate 41 is disposed with an upper surface 41a extending in parallel with a plane that is orthogonal to the Z direction.

The insulating sheet 43 is formed by a sheet-like member having both electrical insulation properties and heat conducting properties. In the embodiment, the insulating sheet 43 is formed by a resin sheet member. The insulating sheet 43 is placed on the upper surface 41a of the base plate 41. In the embodiment, the insulating sheet 43 bonds the upper surface 41a of the base plate 41 and the lower surfaces of the element substrates 42 to each other for fixation through thermo-compression bonding.

The element substrates 42 are placed on the upper surface of the insulating sheet 43. A switching element 31 and a diode element 32 are placed on the upper surface of each of the element substrates 42. The element substrates 42 are formed from a conductive material (for example, a metal material such as copper or aluminum). The element substrates 42 also function as a heat spreader. With the element substrates 42 fixed to the base plate 41 via the insulating sheet 43 having both electrical insulation properties and heat conducting properties as described above, heat of the switching elements 31 can be efficiently transmitted to the heat radiation fins 41b while securing electrical insulation between the element substrates 42 and the base plate 41.

In the embodiment, as shown in FIG. 1, six element substrates 42 are disposed on the upper surface of the insulating sheet 43. Specifically, the six element substrates 42 are disposed such that three element substrates 42 are arranged in the X direction and two element substrates 42 are arranged in the Y direction. Here, as shown in FIG. 1, the X direction is defined as a direction that is orthogonal to both the pressing direction Z and the extending direction Y of the crossover portions 52.

In the embodiment, one switching element 31 and one diode element 32 are placed on the upper surface of each of the element substrates 42. That is, in the embodiment, the switching module 33 includes six switching elements 31 and six diode elements 32. The switching elements 31 and the diode elements 32 form an inverter circuit (see FIG. 3) that drives the rotary electric machine 2 to be discussed later. In the embodiment, each of the switching elements 31 is formed by an IGBT (insulated gate bipolar transistor).

Each of the switching elements 31 may also be formed by an MOSFET (metal oxide semiconductor field effect transistor). In the embodiment, as shown in FIG. 1, the switching element 31 and the diode element 32 placed on an identical element substrate 42 are disposed adjacent to each other to be arranged along the Y direction, Each of the switching elements 31 includes an emitter electrode on the upper surface and a collector electrode on the lower surface. Each of the diode elements 32 includes an anode electrode on the upper surface and a cathode electrode on the lower surface. The switching element 31 is fixed to the element substrate 42 by soldering to bring the collector electrode on the lower surface into continuity with the element substrate 42. The diode element 32 is fixed to the element substrate 42 by soldering to bring the cathode electrode on the lower surface into continuity with the element substrate 42. That is, the element substrate 42 is at the same potential as the collector electrode of the switching element 31 and the cathode electrode of the diode element 32.

A first electrode member 81, which serves as a first one of the electrode members 80, is disposed to electrically connect the upper surface (emitter electrode) of the switching element 31 and the upper surface (anode electrode) of the diode element 32. A second electrode member 82, which serves as a second one of the electrode members 80, is placed on the upper surface of the element substrate 42 on which the switching element 31 and the diode element 32 are disposed. Both the first electrode member 81 and the second electrode member 82 are formed from a conductive material (for example, a metal material such as copper or aluminum). Since the element substrate 42 is formed from a conductive material, the second electrode member 82 is brought into continuity with the lower surface (collector electrode) of the switching element 31 and the lower surface (cathode electrode) of the diode element 32 via the element substrate 42. In the following description, the first electrode member 81 and the second electrode member 82 are referred to collectively as the "electrode member 80" unless it is specifically required to distinguish them from each other.

In the embodiment, as shown in FIG. 1, the first electrode member 81 is shaped by bending a belt-like member (plate-like member) with a constant width. The first electrode member 81 includes an opposite element-side electrode portion, on the upper surface of which the joint surface 80a is formed, a first element-side electrode portion fixed to the upper surface of the switching element 31 by soldering, a second element-side electrode portion fixed to the upper surface of the diode element 32 by soldering, a first coupling portion that couples the opposite element-side electrode portion and the first element-side electrode portion to each other, and a second coupling portion that couples the opposite element-side electrode portion and the second element-side electrode portion to each other. The upper surface (emitter electrode) of the switching element 31 and the upper surface (anode electrode) of the diode element 32 are connected to the bus bar 50 via the first electrode member 81. The shape of the first electrode member 81 may be changed appropriately. For example, the first element-side electrode portion and the second element-side electrode portion may be displaced in the extending direction Y so as not to overlap the opposite element-side electrode portion as viewed in the pressing direction Z. The first electrode member 81 may also be formed by a block-like member.

In the embodiment, as shown in FIG. 1, the second electrode member 82 is formed by a block-like member having the joint surface 80a on the upper surface. The lower surface of the second electrode member 82 is fixed to the upper surface of the element substrate 42 by soldering. The lower surface (collector electrode) of the switching element 31 and the lower surface (cathode electrode) of the diode element 32 are connected to the bus bar 50 via the second electrode member 82. The shape of the second electrode member 82 may be changed appropriately. The second electrode member 82 may also be formed by bending a belt-like member (plate-like member) with a constant width as with the first electrode member 81.

Thus, the switching module 33 includes a plurality of (in the embodiment, twelve) electrode members 80 for connection between the switching elements 31 and the diode elements 32 and the bus bars 50. Although not shown in FIG. 1, the switching module 33 includes electrode members 80 (a positive electrode member 83 and a negative electrode member 84 shown in FIG. 3) for connection between the power source (not shown) and the bus bars 50. The joint surface 80a is formed on the upper surface of each of the electrode members 80. In the embodiment, each of the electrode members 80 is disposed such that the joint surface 80a extends in parallel with a plane that is orthogonal to the Z direction.

In the embodiment, the electrode member 80 and the bus bar 50 are joined to each other by laser welding. The laser welding is performed by radiating laser light from the side of the upper surface of the bus bar 50 (joint portion 51) in the Z-axis direction or a direction inclined slightly (for example, by five degrees) from the Z-axis direction. Laser for welding such as YAG laser, $CO_2$ laser, or semiconductor laser, for example, may be used in the laser welding. In the embodiment, YAG laser is used.

In order to enhance the reliability of the joint between the bus bar 50 and the electrode member 80, it is desirable that the joint portion 51 and the joint surface 80a of the electrode member 80 should be in good surface contact with each other during joining (in the embodiment, during laser welding). In the embodiment, as discussed in detail in Section 2, it is easy to press the support body 60 such that a load is applied to the joint portion 51 equally or generally equally from both sides in the extending direction Y, and it is easy to bring the joint portion 51 into good surface contact with the joint surface 80a of the electrode member 80 during joining. Here, the term "generally equally" is used to mean a concept covering an allowable range of variations in load from the viewpoint of the reliability of the joint between the joint portion 51 and the joint surface 80a.

Next, the inverter circuit formed by the switching elements 31 and the diode elements 32 discussed above will be described. As shown in FIG. 3, the inverter circuit is formed by a bridge circuit, and two switching elements 31 are connected in series between the positive electrode P side and the negative electrode N side (for example, ground side) of the power source to form a series circuit, and three such series circuits are connected in parallel. Each of the series circuits corresponds to each of the three phases (U-phase, V-phase, and W-phase) of a stator coil of the rotary electric machine 2. Reference numeral 92 denotes a smoothing circuit that includes a capacitor and an inductor for smoothing.

Figure 3:
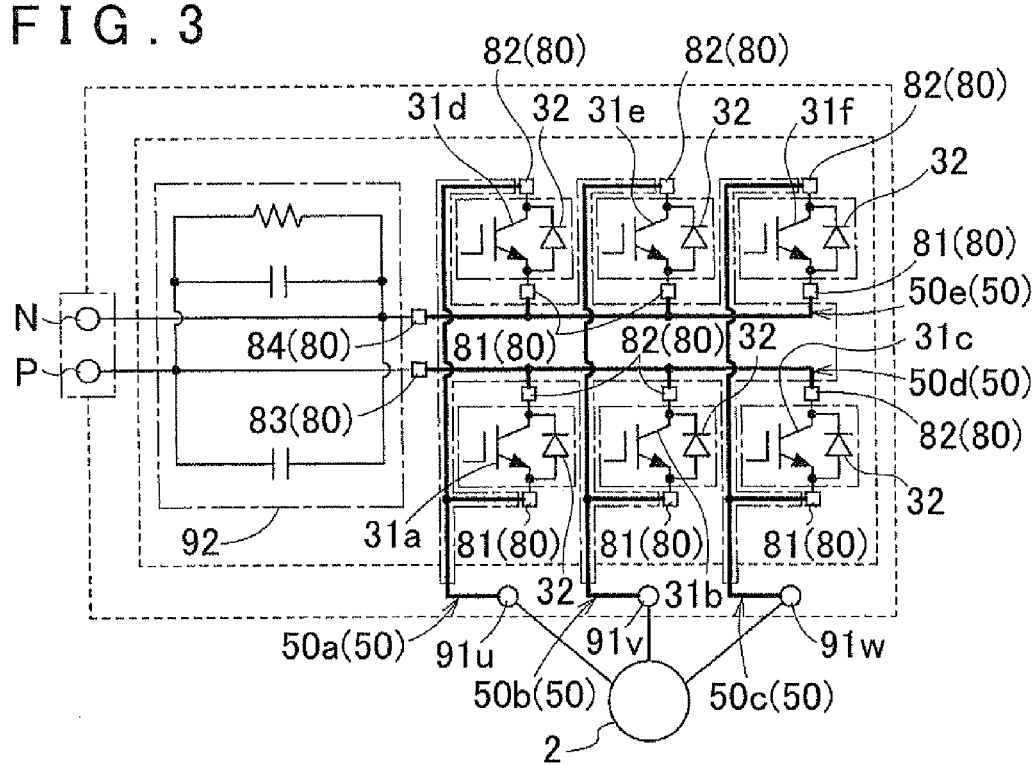
FIG. 3 is a schematic diagram showing the configuration of an inverter circuit according to the embodiment of the present invention.

In FIGS. 1 and 3, reference numeral 31a denotes a U-phase upper-stage switching element, reference numeral 31b denotes a V-phase upper-stage switching element, and reference numeral 31c denotes a W-phase upper-stage switching element. In addition, reference numeral 31d denotes a U-phase lower-stage switching element, reference numeral 31e denotes a V-phase lower-stage switching element, and reference numeral 31f denotes a W-phase lower-stage switching element. Here, the term "upper-stage" indicates an arm on the positive electrode P side, and the term "lower-stage" indicates an arm on the negative electrode N side.

The collectors of the upper-stage switching elements 31a, 31b, and 31c for the respective phases are connected to the positive electrode P side. The emitters of the upper-stage switching elements 31a, 31b, and 31c for the respective phases are connected to the collectors of the lower-stage switching elements 31d, 31e, and 31f for the respective phases. The emitters of the lower-stage switching elements 31d, 31e, and 31f for the respective phases are connected to the negative electrode N side. The diode element 32 is connected in parallel between the emitter and the collector of the switching element 31. The anode and the cathode of the diode element 32 are connected to the emitter and the collector, respectively, of the switching element 31. Each of the diode elements 32 is used as an FWD (Free Wheel Diode).

Intermediate points (points of connection between the switching elements 31) of the series circuits formed by the paired switching elements (31a, 31d), (31b, 31e), and (31c, 31f) for the respective phases are respectively connected to coils of the rotary electric machine 2 for the respective phases via rotary electric machine connection terminals 91u, 91v, and 91w. The gates of the switching elements 31 are connected to a control unit (not shown) so as to be individually subjected to switching control. In the embodiment, the control unit is disposed above the bus bar module 1 in proximity to the bus bar module 1.

The control unit supplies a three-phase AC voltage to the rotary electric machine 2 by controlling (for example, through pulse width modulation control or the like) the switching elements 31 on the basis of a required rotational speed and a required torque required for the rotary electric machine 2. Accordingly, the control unit causes the rotary electric machine 2 to perform power running in accordance with the required rotational speed and the required torque. On the other hand, in the case where the rotary electric machine 2 functions as an electric generator and is supplied with electric power from the rotary electric machine 2, the control unit controls the switching elements 31 so as to convert a generated AC voltage into a DC voltage.

2. Configuration of Bus Bar Module

Next, the configuration of the bus bar module 1 which is the key feature of the present invention will be described in detail. The bus bar module 1 includes the bus bars 50 and the support body 60. In the embodiment, the bus bar module 1 includes five bus bars 50, namely the first bus bar 50a, the second bus bar 50b, the third bus bar 50c, the fourth bus bar 50d, and the fifth bus bar 50e.

As shown in FIG. 3, the first bus bar 50a, the second bus bar 50b, and the third bus bar 50c function to respectively connect the intermediate points of the series circuits formed by the switching elements 31 for the respective phases and the coils of the rotary electric machine 2 for the respective phases. Therefore, as shown in FIGS. 2 and 4, each of the first bus bar 50a, the second bus bar 50b, and the third bus bar 50c includes the joint portions 51 to be joined to the electrode members 80 and the rotary electric machine connection terminal 91u, 91v, or 91w for connection to the coil of the rotary electric machine 2.

Figure 4:
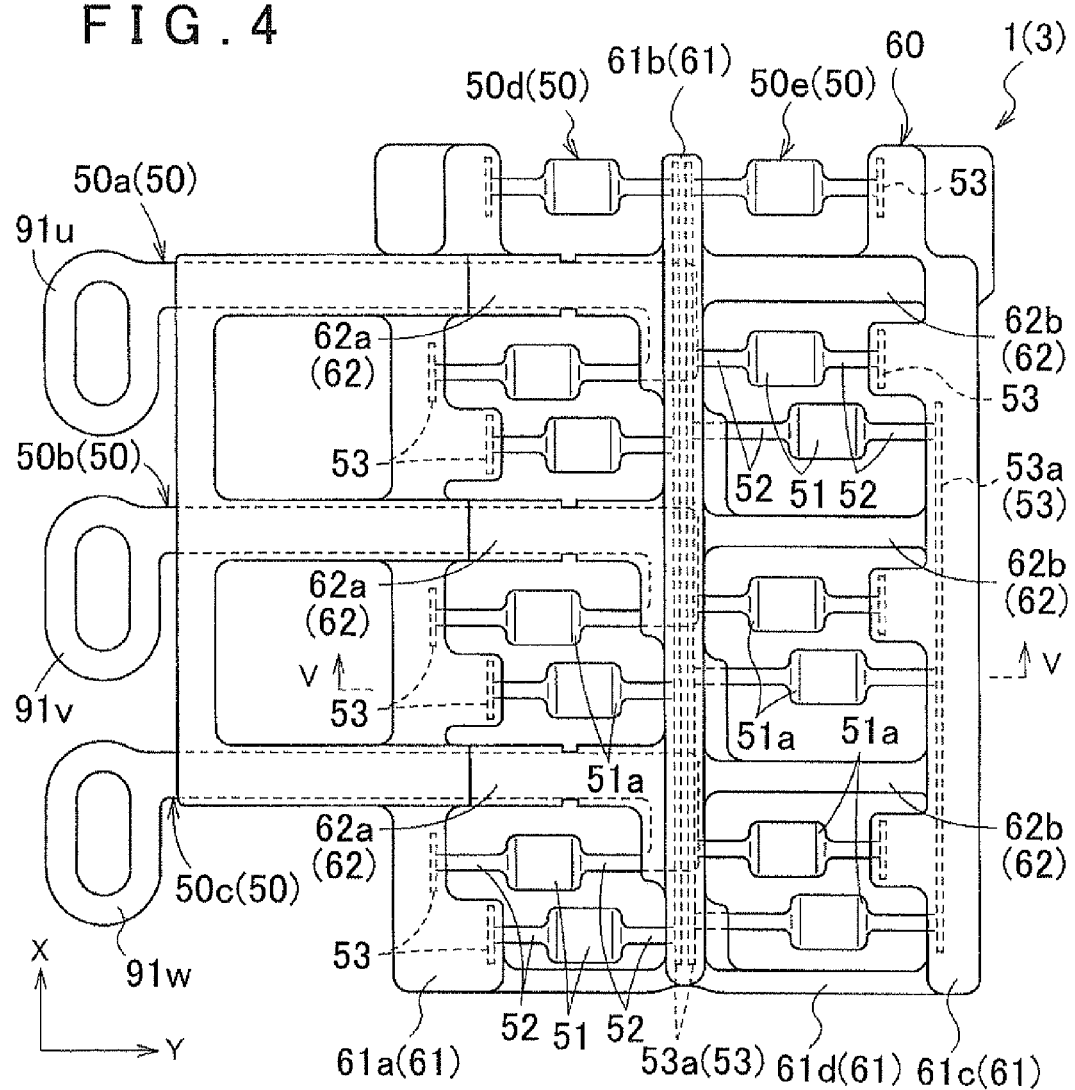
FIG. 4 is a plan view of the bus bar module according to the embodiment of the present invention.

Specifically, the first bus bar 50a includes the joint portion 51 to be joined to the second electrode member 82 on the element substrate 42 on which the U-phase lower-stage switching element 31d is disposed, the joint portion 51 to be joined to the first electrode member 81 on the element substrate 42 on which the U-phase upper-stage switching element 31a is disposed, and the U-phase rotary electric machine connection terminal 91u for connection to the U-phase coil of the rotary electric machine 2, which are arranged in the order of description toward the −Y direction in FIG. 4. Thus, the first bus bar 50a includes a plurality of (specifically, two) joint portions 51.

The second bus bar 50b includes the joint portion 51 to be joined to the second electrode member 82 on the element substrate 42 on which the V-phase lower-stage switching element 31e is disposed, the joint portion 51 to be joined to the first electrode member 81 on the element substrate 42 on which the V-phase upper-stage switching element 31b is disposed, and the V-phase rotary electric machine connection terminal 91v for connection to the V-phase coil of the rotary electric machine 2, which are arranged in the order of description toward the −Y direction in FIG. 4. Thus, the second bus bar 50b includes a plurality of (specifically, two) joint portions 51.

The third bus bar 50c includes the joint portion 51 to be joined to the second electrode member 82 on the element substrate 42 on which the W-phase lower-stage switching element 31f is disposed, the joint portion 51 to be joined to the first electrode member 81 on the element substrate 42 on which the W-phase upper-stage switching element 31c is disposed, and the W-phase rotary electric machine connection terminal 91w for connection to the W-phase coil of the rotary electric machine 2, which are arranged in the order of description toward the -Y direction in FIG. 4. Thus, the third bus bar 50c includes a plurality of (specifically, two) joint portions 51.

As shown in FIG. 3, the fourth bus bar 50d functions to connect the collectors of the upper-stage switching elements 31a, 31b, and 31c for the respective phases to the positive electrode P side of the power source. Specifically, the fourth bus bar 50d includes the joint portion 51 to be joined to the positive electrode member 83, the joint portion 51 to be joined to the second electrode member 82 on the element substrate 42 on which the U-phase upper-stage switching element 31a is disposed, the joint portion 51 to be joined to the second electrode member 82 on the element substrate 42 on which the V-phase upper-stage switching element 31b is disposed, and the joint portion 51 to be joined to the second electrode member 82 on the element substrate 42 on which the W-phase upper-stage switching element 31c is disposed, which are arranged in the order of description toward the −X direction in FIG. 4. Thus, the fourth bus bar 50d includes four joint portions 51.

As shown in FIG. 3, the fifth bus bar 50e functions to connect the emitters of the lower-stage switching elements 31d, 31e, and 31f for the respective phases to the negative electrode N side of the power source. Specifically, the fifth bus bar 50e includes the joint portion 51 to be joined to the negative electrode member 84, the joint portion 51 to be joined to the first electrode member 81 on the element substrate 42 on which the U-phase lower-stage switching element 31d is disposed, the joint portion 51 to be joined to the first electrode member 81 on the element substrate 42 on which the V-phase lower-stage switching element 31e is disposed, and the joint portion 51 to be joined to the first electrode member 81 on the element substrate 42 on which the W-phase lower-stage switching element 31f is disposed, which are arranged in the order of description toward the −X direction in FIG. 4. Thus, the fifth bus bar 50e includes four joint portions 51.

In the embodiment, as discussed above, the first bus bar 50a, the second bus bar 50b, and the third bus bar 50c are used to connect the switching module 33 to the rotary electric machine. Meanwhile, the fourth bus bar 50d and the fifth bus bar 50e are used to connect the switching module 33 to the power source. As shown in FIGS. 1 and 4, the five bus bars 50 are integrally supported by the support body 60.

In the embodiment, as shown in FIGS. 1 and 4, the support body 60 integrally includes an outer frame portion 61 and beam-shaped portions 62. The outer frame portion 61 is integrally formed with a first side frame 61a extending in the X direction, a second side frame 61c provided on the Y direction side with respect to the first side frame 61a and extending in the X direction, an intermediate frame 61b provided between the first side frame 61a and the second side frame 61c (in the embodiment, at the middle position) in the Y direction and extending in the X direction, and a coupling frame 61d extending in the Y direction and coupling respective end portions of the first side frame 61a, the intermediate frame 61b, and the second side frame 61c on the −X direction side. The upper surface of the first side frame 61a, the upper surface of the intermediate frame 61b, and the upper surface of the second side frame 61c form a surface of the bus bar module 1 to be pressed, and the joint portions 51 supported by the support body 60 are pressed against the joint surfaces 80a of the electrode members 80 by a force applied in the Z direction to the surface to be pressed.

In the embodiment, a plurality of (in the embodiment, six) beam-shaped portions 62 are formed integrally with the outer frame portion 61. Specifically, as shown in FIGS. 1 and 4, three beam-shaped portions 62 are formed to connect the first side frame 61a and the intermediate frame 61b in the Y direction. The three beam-shaped portions 62 serve as retention beam-shaped portions 62a, inside which a part of the bus bar 50 is retained for fixation. Also, three beam-shaped portions 62 are formed to connect the intermediate frame 61b and the second side frame 61c in the Y direction. The three beam-shaped portions 62 serve as non-retention beam-shaped portions 62b, inside which the bus bar 50 is not retained for fixation. Thus, in the embodiment, the support body 60 includes the plurality of beam-shaped portions 62 extending in the same direction as each other (in the embodiment, Y direction). The plurality of beam-shaped portions 62 include the retention beam-shaped portions 62a and the non-retention beam-shaped portions 62b. In the following description, the retention beam-shaped portions 62a and the non-retention beam-shaped portions 62b are referred to collectively as the "beam-shaped portions 62" unless it is specifically required to distinguish them from each other.

In the embodiment, as described above, the support body 60 is formed in the shape of a frame including the outer frame portion 61 and the beam-shaped portions 62. As shown in FIG. 4, the support body 60 defines eight compartments, six of which are surrounded on all sides as viewed in plan. Two joint portions 51 are disposed in each of the six compartments. The remaining two compartments provided on the X direction side are surrounded on three sides as viewed in plan. One joint portion 51 is disposed in each of the two compartments. That is, in the embodiment, the support body 60 is disposed at least on both sides of the joint portions 51 in the extending direction Y. Further, the support body 60 is disposed on both sides of some particular joint portions 51 in the X direction, and only on one side of other particular joint portions 51 in the X direction.

Thus, the support body 60 is disposed on both sides of all the joint portions 51 provided in the bus bar module 1 at least in the extending direction Y of the crossover portions 52. This allows the support body 60 to support the joint portions 51 from both sides in the extending direction Y. Specifically, the support body 60 integrally supports the supported portions 53 on both sides of the joint portions 51 to support the joint portions 51 from both sides in the extending direction Y in the state of being spaced apart from the joint portions 51. Accordingly, in the bus bar module 1, it is easy to press the support body 60 such that a load is applied to the joint portions 51 equally or generally equally from both sides in the extending direction Y. As a result, in the bus bar module 1, it is easy to bring the joint portions 51 into good surface contact with the joint surfaces 80a of the electrode members 80 as shown in FIGS. 6A and 6B.

Figure 6A:
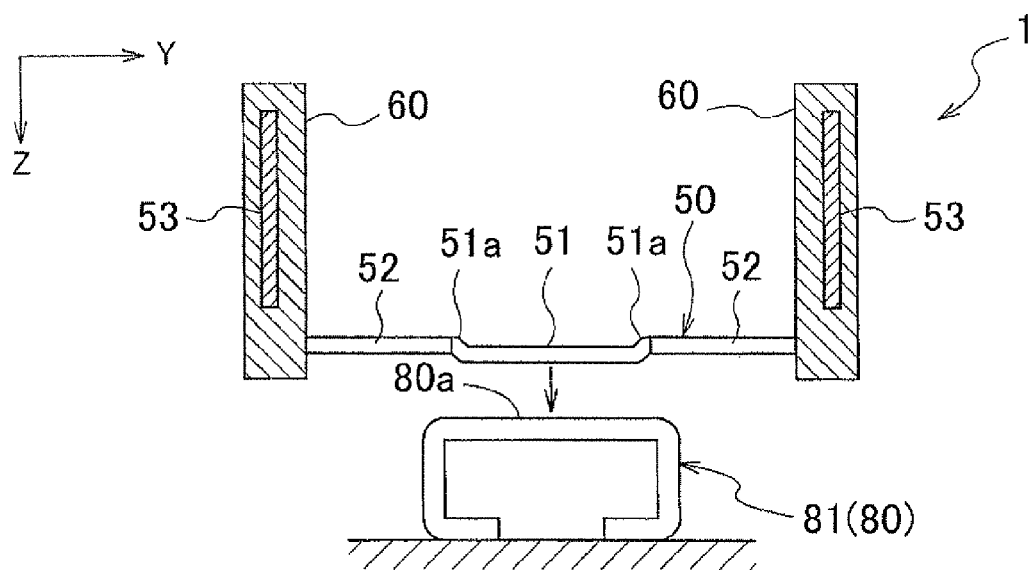
FIG. 6A and 6B show the concept of a process for pressing a bus bar against an electrode member according to the embodiment of the present invention.
Figure 6B:
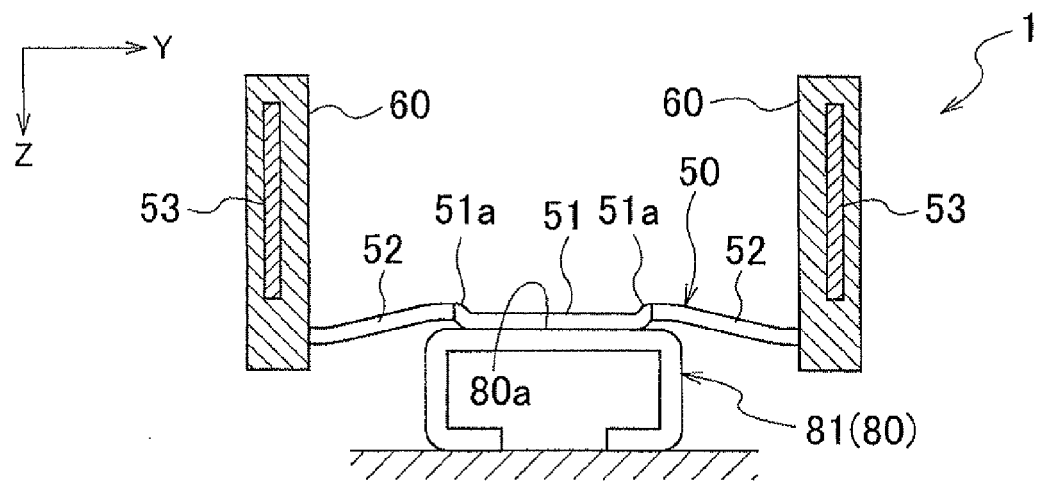

FIGS. 6A and 6B illustrate the concept of a process for pressing the bus bar 50 against the electrode member 80. FIG. 6A schematically shows a state before pressing. FIG. 6B schematically shows a state during pressing. A joining process (in the embodiment, laser welding process) is executed in the pressing state. Although not described in detail, in the state of FIG. 6B, the lower surface of the support body 60 is positioned in the pressing direction Z by a member (not shown) (such as a case that surrounds the element substrates 42 on the base plate 41, for example). In the embodiment, the bus bar 50 is maintained in the state of being pressed against the electrode member 80 even after the termination of the joining process. For example, a space accommodating the support body 60 (for example, a space surrounded by a case) may be filled with a filler (for example, a resin such as an epoxy resin) after the termination of the joint process so that the support body 60 is supported for fixation by the filler after being hardened.

In the embodiment, the supported portions 53 are retained inside the support body 60 for fixation. While only some of the supported portions 53 are given reference numerals for simplicity in FIGS. 2 and 4, all the portions of the bus bars 50 that are fixed to the support body 60 (in the embodiment, portions disposed inside the support body 60) function as supported portions.

In the embodiment, as described above, each of the bus bars 50 includes a plurality of joint portions 51. Each of the joint portions 51 is supported by the support body 60 via a pair of crossover portions 52. Specifically, as described above, each of the first bus bar 50a, the second bus bar 50b, and the third bus bar 50c includes two joint portions 51, and each of the fourth bus bar 50d and the fifth bus bar 50e includes four joint portions 51. Hence, 14 joint portions 51 are provided in all the bus bars 50. The support body 60 is formed to integrally support a plurality of pairs (in the embodiment, 14 pairs) of supported portions 53 for the plurality of (in the embodiment, 14) joint portions 51. Accordingly, each of the plurality of joint portions 51 can be pressed against the joint-target joint surface 80a of the electrode members 80 by applying a force in the pressing direction Z to the support body 60. That is, the joint portions 51 can be pressed against the joint-target joint surfaces 80a all at once, which makes it possible to simplify the process for joining the bus bars 50 to the electrode members 80.

In order to bring the joint portions 51 into good surface contact with the joint surfaces 80a of the electrode members 80 during joining, it is desirable to suppress deformation of the joint portions 51 due to a stress while being pressed against the electrode members 80. In the embodiment, deformation of the joint portions 51 while being pressed against the electrode members 80 is suppressed by providing the following configuration. In the embodiment, as shown in FIGS. 2 and 4, the 14 joint portions 51 provided in the bus bar module 1 are formed in the same shape as each other. The 14 pairs of crossover portions 52 provided in the bus bar module 1 have two types of extending lengths, long and short, in the Y direction, but otherwise are formed in the same shape as each other. Hence, in the following description, the joint portions 51 are described with no distinction unless it is required to do so.

Figure 5:
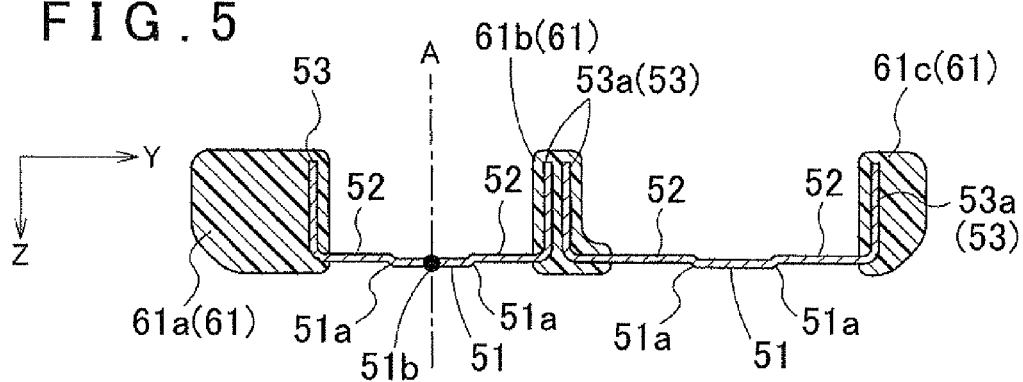
FIG. 5 is a V-V cross-sectional view of FIG. 4.

As shown in FIGS. 2, 4, and 5, each of the joint portions 51 has a bent portion 51a that is provided at at least a portion of a peripheral portion of the joint portion 51 and that is bent in the thickness direction (in the embodiment, a direction in parallel with the pressing direction Z). In the embodiment, the joint portion 51 is formed in a rectangular shape as viewed in plan (viewed in the Z direction), and the bent portion 51a is formed at peripheral portions of the joint portion 51 on both sides in the Y direction. Further, the crossover portions 52 are formed in the shape of a belt disposed with its thickness direction extending in parallel with the pressing direction Z. The crossover portions 52 are formed to be smaller than the joint portion 51 in at least one of thickness and width. Here, the term "parallel" is used to mean a concept covering "parallel" and "generally parallel" which is shifted from the parallel direction by a predetermined angle (for example, an angle within 10 degrees). In the embodiment, the crossover portions 52 are formed to be smaller than the joint portion 51 in width in the X direction, and to be equal to the joint portion 51 in thickness. Specifically, the crossover portions 52 are formed to be about one-fourth the joint portion 51 in width in the X direction.

With such a configuration, the rigidity (deformation resistance) of the joint portion 51 can be enhanced compared to the crossover portions 52. Therefore, as conceptually shown in FIG. 6B, a stress produced in the bus bar 50 while being pressed against the electrode member 80 can be absorbed through deformation of the crossover portions 52, which makes it possible to suppress deformation of the joint portion 51 and keep the joint portion 51 in a flat plate shape.

Further, as shown in FIGS. 4 and 5, the pair of crossover portions 52 disposed on both sides of the joint portion 51 in the extending direction Y are shaped to be plane-symmetric to each other with respect to a plane (plane of symmetry A) that passes through a center of gravity 51b (shown in an exaggerated manner in FIG. 5) of the joint portion 51 and that is orthogonal to the extending direction Y. This allows the pair of crossover portions 52 to be equal in rigidity to each other, which enables a stress produced in the bus bar 50 while being pressed against the electrode member 80 to be absorbed equally on both sides of the joint portion 51 in the extending direction Y. That is, it is possible to press the support body 60 such that a load is applied to the joint portions 51 equally or generally equally from both sides in the extending direction Y. Also from this point, it is possible to bring the joint portions 51 into good surface contact with the joint surfaces 80a of the electrode members 80 during joining.

In the embodiment, as shown in FIGS. 4 and 5, the joint portion 51 is also plane-symmetric with respect to the plane of symmetry A. In addition, a pair of supported portions 53 on both sides, in the extending direction Y, of each of the joint portions 51 provided in the fourth bus bar 50d and the fifth bus bar 50e are formed to have the same height (length in the Z direction) as each other. That is, in the embodiment, as shown in FIG. 5, the shape of a portion formed by each of the joint portions 51 provided in the fourth bus bar 50d and the fifth bus bar 50e and a pair of crossover portions 52 and a pair of supported portions 53 for such a joint portion 51 in a cross section (YZ cross section) that is orthogonal to the X direction is line-symmetric with respect to a line segment formed by the plane of symmetry A.

In the embodiment, as described above, the support body 60 is formed to integrally support a plurality of pairs (in the embodiment, 14 pairs) of supported portions 53 for the plurality of (in the embodiment, 14) joint portions 51. In order to bring all the plurality of joint portions 51 into good surface contact with the joint-target joint surfaces 80a of the electrode members 80 during joining, it is desirable that the support body 60 should not be significantly locally deformed while being pressed against the electrode members 80. In the embodiment, local deformation of the support body 60 while being pressed against the electrode members 80 is suppressed by providing the following configuration.

As shown in FIGS. 1 and 2, the thickness of the non-retention beam-shaped portions 62b in the pressing direction Z is larger than the thickness of the retention beam-shaped portions 62a in the pressing direction Z. In the embodiment, the bus bars 50 are formed from a material that is more rigid than the material forming the support body 60. Therefore, in the case where the retention beam-shaped portions 62a and the non-retention beam-shaped portions 62b have the same thickness in the pressing direction Z as each other, the retention beam-shaped portions 62a are more rigid than the non-retention beam-shaped portions 62b. In the embodiment, the thickness of the non-retention beam-shaped portions 62b in the pressing direction Z is larger than the thickness of the retention beam-shaped portions 62a in the pressing direction Z, which reduces the difference between the rigidity of the retention beam-shaped portions 62a and the rigidity of the non-retention beam-shaped portions 62b. At this time, the thickness of the retention beam-shaped portions 62a in the pressing direction Z and the thickness of the non-retention beam-shaped portions 62b in the pressing direction Z are preferably set such that the retention beam-shaped portions 62a and the non-retention beam-shaped portions 62b have the same or generally the same rigidity as each other. Here, the term "generally the same" is used to mean a concept covering an allowable range of variations in rigidity from the viewpoint of the reliability of the joint between the joint portion 51 and the joint surface 80a of the electrode member 80. Further, the supported portions 53 are formed to be larger than the crossover portions 52 in at least one of length in the pressing direction Z and length in a direction (that is, X direction) that is orthogonal to both the extending direction Y and the pressing direction 1 Accordingly, a load received by the support body 60 from the bus bars 50 while being pressed against the electrode members 80 can be dispersed within the support body 60, which enables the bus bars 50 to be supported by the support body 60 over a wide range.

With such a configuration, the support body 60 is prevented from being significantly locally deformed while being pressed against the electrode members 80, which makes it easy to press the support body 60 such that a load is applied to all the plurality of joint portions 51 equally or generally equally from both sides in the extending direction Y.

In the embodiment, as shown in FIGS. 2, 4, and 5, for the fourth bus bar 50d and the fifth bus bar 50e, each of the pair of supported portions 53 is formed to be larger than the crossover portions 52 in both length in the pressing direction Z and length in the X direction. As shown in FIG. 5, the pair of supported portions 53 are formed to be equal to each other in length in the pressing direction Y.

In the embodiment, further, as shown in FIGS. 2 and 4, in the fourth bus bar 50d, the supported portions 53, on the Y direction side, for the four joint portions 51 are formed integrally to be continuous in the X direction to form a common supported portion 53a. On the other hand, the supported portions 53, on the −Y direction side, for the four joint portions 51 are formed independently of each other.

In the fifth bus bar 50e, the supported portions 53, on the −Y direction side, for the four joint portions 51 are formed integrally to be continuous in the X direction to form a common supported portion 53a. In addition, the supported portions 53, on the Y direction side, for three joint portions 51, of the four joint portions 51, on the −X direction side are formed integrally to be continuous in the X direction to form a common supported portion 53a. With such a configuration, a looped current path is formed for the fifth bus bar 50e, which makes it possible to reduce a power loss due to a reduction in inductance.

For the first bus bar 50a, the second bus bar 50b, and the third bus bar 50c, on the other hand, one of each pair of supported portions 53 is formed to be larger than the crossover portions 52 in length in the pressing direction Z, and the other supported portion 53 is formed to be the same as the crossover portions 52 in length in the pressing direction Z. In addition, both of each pair of supported portions 53 are formed to be larger than the crossover portions 52 in length in the X direction.

3. Other Embodiments

Lastly, other embodiments of the present invention will be described. The characteristics disclosed in each of the following embodiments are not only applicable to that particular embodiment but also to any other embodiment unless any contradiction occurs.

(1) In the embodiment described above, the crossover portions 52 extend in the Y direction. However, the crossover portions 52 may extend in any direction that crosses the pressing direction Z. For example, the crossover portions 52 may extend in a direction that crosses the Z direction by an angle of 80 degrees, 85 degrees, 95 degrees, or 100 degrees.

(2) In the embodiment described above, each of the joint portions 51 has the bent portion 51a at peripheral portions on both sides in the Y direction, However, the present invention is not limited to such an embodiment, and each of the joint portions 51 may have the bent portion 51a which is provided at peripheral portions on both sides in the X direction and which is bent in the thickness direction, in addition to or in place of the bent portion 51a at peripheral portions in the Y direction. Moreover, each of the joint portions 51 may have the bent portion 51a at a peripheral portion only on one side in the Y direction, have the bent portion 51a at a peripheral portion only on one side in the X direction, or have no bent portion 51a at all. Further, each of the joint portions 51 may be formed with a rib structure, irrespective of whether or not the joint portion 51 has the bent portion 51a.

(3) In the embodiment described above, the joint portions 51 are formed in a rectangular shape as viewed in plan. However, the joint portions 51 may be formed in any shape that has a flat plate portion that is brought into surface contact with the joint surfaces 80a of the electrode members 80. For example, the joint portions 51 may have the shape of a circle (including an ellipse), a polygon other than a rectangle, or the like as viewed in plan.

(4) In the embodiment described above, the width of the crossover portions 52 is smaller than the width of the joint portions 51. However, the present invention is not limited to such an embodiment, and the width of the crossover portions 52 may be the same as or larger than the width of the joint portions 51. It is also preferable that the crossover portions 52 should be formed to be smaller than the joint portions 51 in thickness in addition to the width.

(5) In the embodiment described above, the thickness of the crossover portions 52 is the same as the thickness of the joint portions 51. However, the present invention is not limited to such an embodiment, and the thickness of the crossover portions 52 may be smaller or larger than the thickness of the joint portions 51. In such cases, the magnitude relationship between the width of the crossover portions 52 and the width of the joint portions 51 may be set as desired.

(6) In the embodiment described above, the crossover portions 52 are formed in a belt shape. However, the crossover portions 52 may be formed in a shape (for example, bar-like shape) other than a belt shape. In the embodiment described above, both the width and the thickness of the crossover portions 52 are uniform in the extending direction Y. However, at least one of the width and the thickness of the crossover portions 52 may not be uniform in the extending direction Y, but may vary in accordance with the position in the extending direction Y.

(7) In the embodiment described above, the pair of crossover portions 52 disposed on both sides of the joint portion 51 in the extending direction Y are shaped to be plane-symmetric to each other with respect to a plane (plane of symmetry A) that passes through the center of gravity 51b of the joint portion 51 and that is orthogonal to the extending direction Y. However, the present invention is not limited to such an embodiment, and the pair of crossover portions 52 disposed on both sides of the joint portion 51 in the extending direction Y may be formed to be different from each other in width, thickness, shape as viewed in plan, or the like.

(8) In the embodiment described above, the support body 60 is formed to integrally support the plurality of pair of supported portions 53 for the plurality of joint portions 51. However, the present invention is not limited to such an embodiment, and the support body 60 may be formed to integrally support only one pair of supported portions 53 for one of the joint portions 51.

(9) In the embodiment described above, the non-retention beam-shaped portions 62b are formed to be larger than the retention beam-shaped portions 62a in thickness in the pressing direction Z. However, the present invention is not limited to such an embodiment, and the non-retention beam-shaped portions 62b may be formed to be equal to or smaller than the retention beam-shaped portions 62a in thickness in the pressing direction Z.

(10) In the embodiment described above, the supported portions 53 are formed to be larger than the crossover portions 52 in at least one of length in the Z direction (pressing direction) and length in the X direction. However, the present invention is not limited to such an embodiment, and the supported portions 53 may be formed to be equal to or smaller than the crossover portions 52 in both length in the Z direction (pressing direction) and length in the X direction.

(11) In the embodiment described above, the supported portions 53 of the bus bars 50 are retained inside the support body 60 for fixation. However, the present invention is not limited to such an embodiment, and the supported portions 53 of the bus bars 50 may be fixed to an end surface (the upper surface, the lower surface, or a side surface) of the support body 60.

(12) In the embodiment described above, the present invention is applied to the bus bar module 1 forming the inverter module 3 which controls the rotary electric machine 2. However, the present invention is not limited to such an embodiment, and the present invention may be applied to any electrical connection device that has a joint portion to be joined to an electrode member in the state of being pressed against the electrode member.

(13) Also regarding other configurations, the embodiment disclosed herein is illustrative in all respects, and the present invention is not limited thereto. That is, it is a matter of course that a configuration obtained by appropriately altering part of a configuration not disclosed in the claim of the present invention also falls within the technical scope of the present invention as long as the resulting configuration includes a configuration disclosed in the claim or a configuration equivalent thereto.

The present invention may be suitably applied to an electrical connection device that includes a conductive connection member having a joint portion to be joined to an electrode member in the state of being pressed against the electrode member in a predetermined pressing direction, and an insulating support body that supports the connection member.

What is claimed is:

1. An electrical connection device, comprising
a conductive connection member having a joint portion to be joined to an electrode member in a state of being pressed against the electrode member in a predetermined pressing direction, and
an insulating support body that supports the connection member, wherein
the connection member includes the joint portion which is formed in a flat plate shape and which is brought into surface contact with a joint surface of the electrode member, crossover portions sandwiching the joint portion and extending from both sides of the joint portion along a predetermined extending direction, and supported portions spaced apart from the joint portion and provided at respective terminal ends of the crossover portions on both sides, the respective terminal ends being positions of the crossover portions farthest from the joint portion in the predetermined extending direction, the support body is disposed at least on both sides of the joint portion in the extending direction and spaced apart from the joint portion, and formed to be in direct contact with the supported portions so as to integrally support the supported portions on both sides of the joint portion, the crossover portions are formed in a belt shape, and a thickness direction of the crossover portions extends in parallel with the pressing direction, and the crossover portions are formed to be smaller than the joint portion and the supported portions in a width direction perpendicular to the predetermined extending direction.

2. The electrical connection device according to claim 1, wherein the joint portion includes a bent portion that is provided at at least a portion of a peripheral portion of the joint portion and that is bent in a thickness direction.

3. The electrical connection device according to claim 1, wherein a pair of the crossover portions disposed on both sides of the joint portion in the extending direction are shaped to be plane-symmetric to each other with respect to a plane that passes through a center of gravity of the joint portion and that is orthogonal to the extending direction.

4. The electrical connection device according to claim 3, wherein the connection member includes a plurality of the joint portions each supported by the support body via a pair of the crossover portions, and the support body is formed to integrally support a plurality of pairs of the supported portions for the plurality of joint portions.

5. The electrical connection device according to claim 4, wherein the support body includes a plurality of beam-shaped portions extending in the same direction as each other, the plurality of beam-shaped portions include a retention beam-shaped portion, inside which the connection member is retained for fixation, and a non-retention beam-shaped portion, inside which the connection member is not retained for fixation, and the non-retention beam-shaped portion is formed to be larger than the retention beam-shaped portion in thickness in the pressing direction.

6. The electrical connection device according to claim 5, wherein the supported portions of the connection member are retained inside the support body for fixation, and the supported portions are formed to be larger than the crossover portions in at least one of length in the pressing direction and length in a direction that is orthogonal to both the extending direction and the pressing direction.

7. The electrical connection device according to claim 1, wherein the crossover portions are formed in a belt shape, and a thickness direction of the crossover portions extends in parallel with the pressing direction, and the crossover portions are formed to be smaller than the joint portion in at least one of thickness and width.

8. The electrical connection device according to claim 7, wherein the connection member includes a plurality of the joint portions each supported by the support body via a pair of the crossover portions, and the support body is formed to integrally support a plurality of pairs of the supported portions for the plurality of joint portions.

9. The electrical connection device according to claim 8, wherein the support body includes a plurality of beam-shaped portions extending in the same direction as each other, the plurality of beam-shaped portions include a retention beam-shaped portion, inside which the connection member is retained for fixation, and a non-retention beam-shaped portion, inside which the connection member is not retained for fixation, and the non-retention beam-shaped portion is formed to be larger than the retention beam-shaped portion in thickness in the pressing direction.

10. The electrical connection device according to claim 7, wherein the support body includes a plurality of beam-shaped portions extending in the same direction as each other, the plurality of beam-shaped portions include a retention beam-shaped portion, inside which the connection member is retained for fixation, and a non-retention beam-shaped portion, inside which the connection member is not retained for fixation, and the non-retention beam-shaped portion is formed to be larger than the retention beam-shaped portion in thickness in the pressing direction.

11. The electrical connection device according to claim 7, wherein the supported portions of the connection member are retained inside the support body for fixation, and the supported portions are formed to be larger than the crossover portions in at least one of length in the pressing direction and length in a direction that is orthogonal to both the extending direction and the pressing direction.

12. The electrical connection device according to claim 1, wherein a pair of the crossover portions disposed on both sides of the joint portion in the extending direction are shaped to be plane-symmetric to each other with respect to a plane that passes through a center of gravity of the joint portion and that is orthogonal to the extending direction.

13. The electrical connection device according to claim 12, wherein the connection member includes a plurality of the joint portions each supported by the support body via a pair of the crossover portions, and the support body is formed to integrally support a plurality of pairs of the supported portions for the plurality of joint portions.

14. The electrical connection device according to claim 13, wherein the support body includes a plurality of beam-shaped portions extending in the same direction as each other, the plurality of beam-shaped portions include a retention beam-shaped portion, inside which the connection member is retained for fixation, and a non-retention beam-shaped portion, inside which the connection member is not retained for fixation, and the non-retention beam-shaped portion is formed to be larger than the retention beam-shaped portion in thickness in the pressing direction.

15. The electrical connection device according to claim 12, wherein the support body includes a plurality of beam-shaped portions extending in the same direction as each other, the plurality of beam-shaped portions include a retention beam-shaped portion, inside which the connection member is retained for fixation, and a non-retention beam-shaped portion, inside which the connection member is not retained for fixation, and the non-retention beam-shaped portion is formed to be larger than the retention beam-shaped portion in thickness in the pressing direction.

16. The electrical connection device according to claim 12, wherein the supported portions of the connection member are retained inside the support body for fixation, and the supported portions are formed to be larger than the crossover portions in at least one of length in the pressing direction and length in a direction that is orthogonal to both the extending direction and the pressing direction.

17. The electrical connection device according to claim 1, wherein the connection member includes a plurality of the joint portions each supported by the support body via a pair of the crossover portions, and the support body is formed to integrally support a plurality of pairs of the supported portions for the plurality of joint portions.

18. The electrical connection device according to claim 1, wherein the support body includes a plurality of beam-shaped portions extending in the same direction as each other, the plurality of beam-shaped portions include a retention beam-shaped portion, inside which the connection member is retained for fixation, and a non-retention beam-shaped portion, inside which the connection member is not retained for fixation, and the non-retention beam-shaped portion is formed to be larger than the retention beam-shaped portion in thickness in the pressing direction.

19. The electrical connection device according to claim 1, wherein the supported portions of the connection member are retained inside the support body for fixation, and the supported portions are formed to be larger than the crossover portions in at least one of length in the pressing direction and length in a direction that is orthogonal to both the extending direction and the pressing direction.

* * * * *